United States Patent
Yamamoto

(10) Patent No.: US 6,808,960 B2
(45) Date of Patent: Oct. 26, 2004

(54) METHOD FOR MAKING AND PACKAGING IMAGE SENSOR DIE USING PROTECTIVE COATING

(75) Inventor: Katsumi Yamamoto, Shanghai (CN)

(73) Assignee: Omni Vision International Holding Ltd (KY)

( * ) Notice: Subject to any disclaimer, the term of this patent is extended or adjusted under 35 U.S.C. 154(b) by 55 days.

(21) Appl. No.: 10/280,974

(22) Filed: Oct. 25, 2002

(65) Prior Publication Data

US 2004/0082094 A1 Apr. 29, 2004

(51) Int. Cl.⁷ .............................................. H01L 21/44
(52) U.S. Cl. ...................... 438/107; 438/115; 438/116
(58) Field of Search ................. 438/106–119, 460–465, 438/68–72

(56) References Cited

U.S. PATENT DOCUMENTS

| | | | |
|---|---|---|---|
| 5,691,116 A | * 11/1997 | Revelli et al. | ............... 430/321 |
| 6,261,861 B1 | 7/2001 | Pai et al. | |
| 6,274,917 B1 | 8/2001 | Fan et al. | |
| 6,297,071 B1 | 10/2001 | Wake | |
| 6,362,513 B2 | 3/2002 | Wester | |
| 6,482,669 B1 | * 11/2002 | Fan et al. | ...................... 438/70 |
| 6,638,837 B1 | * 10/2003 | Tsao et al. | ................... 438/459 |
| 2001/0033007 A1 | * 10/2001 | Lee | .............................. 257/432 |
| 2002/0158296 A1 | * 10/2002 | Kim | ............................ 257/432 |
| 2003/0004278 A1 | * 1/2003 | Asano et al. | ............. 525/330.6 |

* cited by examiner

Primary Examiner—H. Jey Tsai
(74) Attorney, Agent, or Firm—Perkins Coie LLP

(57) ABSTRACT

A method for increasing the yield of image sensor die and packaging is disclosed. The method comprises first forming a plurality of image sensor die having micro-lenses onto a semiconductor wafer. Next, a protective layer is formed over the image sensor die. The wafer is then diced to separate the image sensor die. The image sensor die are then mounted onto an integrated circuit package. Finally, the protective layer is removed from the image sensor die.

14 Claims, 5 Drawing Sheets

METHOD FOR MAKING AND PACKAGING IMAGE SENSOR DIE USING PROTECTIVE COATING

TECHNICAL FIELD

The present invention relates to the manufacture of image sensor die on a semiconductor wafer, and more particularly, towards an image sensor structure that has increased yield.

BACKGROUND

Image sensors are electronic integrated circuits that can be used to produce still or video images. Solid state image sensors can be either of the charge coupled device (CCD) type or the complimentary metal oxide semiconductor (CMOS) type. In either type of image sensor, a light gathering pixel is formed in a substrate and arranged in a two-dimensional array. Modern image sensors typically contain millions of pixels to provide a high resolution image. An important part of the image sensor are the color filters and micro-lens structures formed atop of the pixels. The color filters, as the name implies, are operative, in conjunction with signal processing, to provide a color image. The micro-lenses serve to focus the incident light onto the pixels, and thus to improve the fill factor of each pixel.

In general, the manufacturing process of integrated circuit (IC) image sensors is similar to that of the vast majority of ICs. A relatively large semiconductor wafer (for example, 300 mm diameter) proceeds through a number of deposition, etching, masking, cleaning, and other steps in order to form devices onto the wafer. Moreover, it is not uncommon for hundreds, if not thousands of discrete IC die to be formed on a single wafer. When the IC die have been fully formed, the wafer is sliced (referred to as dicing) along scribe lines formed in the wafer to separate the individual IC die from one another. After the individual IC die have been separated, the IC die are then mounted onto a package using a die bonding process.

The process of dicing the wafer invariably will result in some amount of particulate matter to be generated that is undesirably deposited onto the micro-lens surface of the IC die. While a cleaning step (using a spray) is typically performed to remove the particulates, this is still not sufficient to remove all of the particulates. This results in a reduced yield.

Moreover, because the micro-lens surface is generally left exposed, a special handling mechanism was employed to prevent damage to the image sensor. The special handling mechanism typically would involve handling the IC die only be the sides and not the micro-lens surface. This in turn further complicated the die bonding process between the IC die and the IC package.

DETAILED DESCRIPTION

The present invention relates to an image sensor structure and method that is conducive to increasing yield from a semiconductor wafer. In the following description, numerous specific details are provided to provide a thorough understanding of the embodiments of the invention. One skilled in the relevant art will recognize, however, that the invention can be practiced without one or more of the specific details, or with other methods, components, etc. In other instances, well-known structures or operations are not shown or described in detail to avoid obscuring aspects of various embodiments of the invention.

Reference throughout the specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
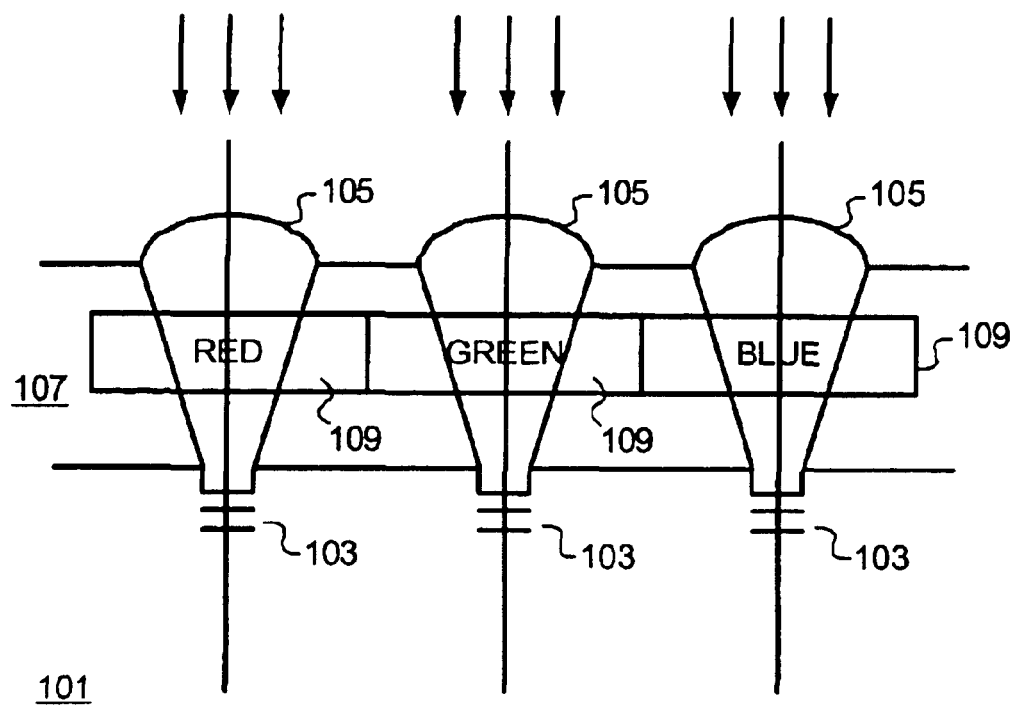
FIG. 1 is a prior art cross sectional view of a portion of an image sensor.

FIG. 1 shows a prior art cross-sectional simplified diagram of an image sensor 101 having micro-lenses formed thereon. As seen in FIG. 1, the image sensor includes a plurality of pixels that have light detecting elements 103 formed in the substrate. The light detecting elements 103 may be one of several types, such as a photodiode, a photogate, or other solid state light sensitive element.

Formed atop of each pixel is a micro-lens 105. The micro-lens 105 focuses incident light onto the light detecting elements 103. Micro-lenses are often formed by spin coating a layer of micro-lens material onto a planarized layer. The micro-lens material is then etched to form cylindrical or other shaped regions that are centered above each pixel. Then, the micro-lens material is heated and reflowed to form a convex hemispherical micro-lens.

Moreover, in the region between the light detecting elements 103 and the micro-lens 105, denoted by reference numeral 107, there are various intervening layers that would typically include the color filter layers 109 and various metal conducting lines. It can be appreciated that the structure of FIG. 1 is merely one example of an image sensor structure and that the present invention is adaptable to any number of variants. For example, the micro-lenses may be concave in nature as disclosed in my co-pending applications. Alternatively, the color filters 109 may be formed atop of the micro-lenses 105.

Figure 2:
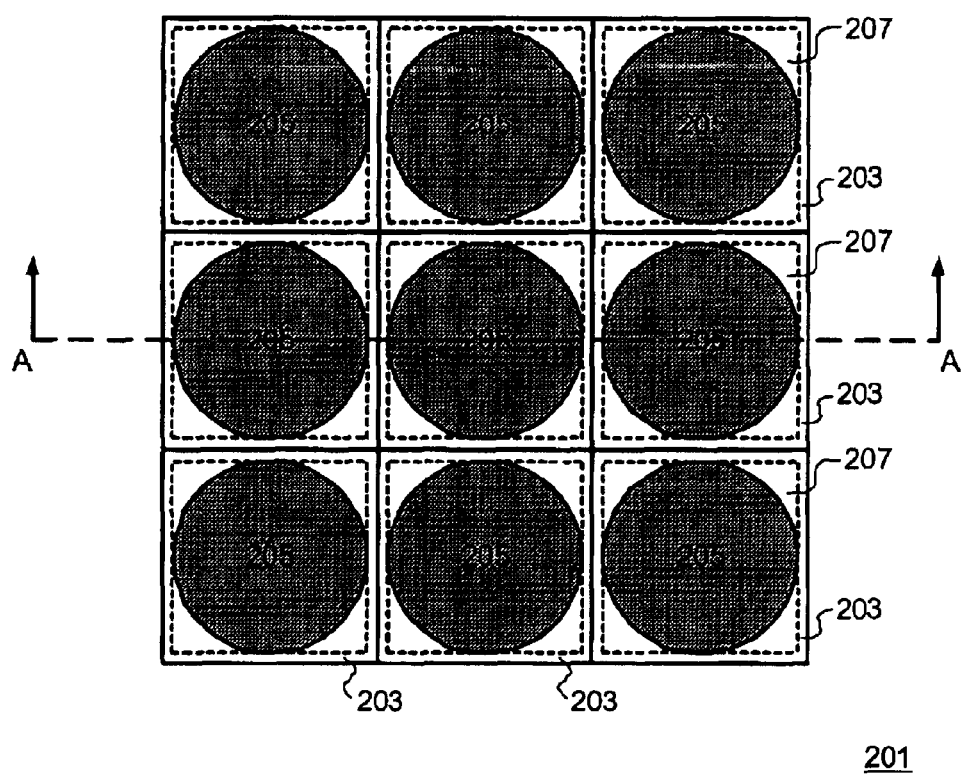
FIG. 2 is a prior art top view of an image sensor showing pixels arranged in a two dimensional array and with micro-lenses formed thereon.

FIG. 2 shows a top view of an image sensor 201. The image sensor 201 includes a plurality of pixels 203 typically arranged in a two dimensional array. In the example shown in FIG. 2, the image sensor shows a three by three array of pixels 203, though it can be appreciated that an actual mage sensor 201 would have many more pixels, arranged in perhaps over a thousand rows and/or a thousand columns. Further, although FIG. 2 shows the pixels in ordered columns and rows, the pixels may be arranged in any type of ordered arrangement. For example, alternating rows may have their pixels slightly offset from each other laterally in a checkerboard format.

The pixels 203 typically include a light sensitive element, such as a photodiode or a photogate as two examples. However, it can be appreciated that other types of light sensitive elements, now known or developed in the future, may be used. Further, the pixels 203 will also include amplification and/or readout circuitry. For clarity, this circuitry is not shown in FIG. 2. In one embodiment, the pixels 203 may be active pixels, commonly known in the prior art. Formed atop of each pixel 203 is a micro-lens 205.

Additionally, associated with each pixel 203 is a color filter 207. The color filter 207 may be placed either between the micro-lens 205 and the light sensitive element, or alternatively, be formed atop of the micro-lens 205. The color filter 207 is typically a pigmented or dyed material that will only allow a narrow band of light to pass therethrough, for example, red, blue, or green. In other embodiments, the color filter may be cyan, yellow, or magenta. These are but example colors for the color filters 207 and the present invention is meant to encompass a color filter 207 having any color.

While the use of pigmented or dyed color materials is the most prevalent form of color filters, other reflective type color filters may be used, such as a multilayer stack reflective material. The formation of color filters 207 is known in art and will not be described herein to avoid any unnecessary obscuration with the description of the present invention. For example, U.S. Pat. Nos. 6,297,071, 6,362,513, and 6,271,900 show the current state of the color filter art. Not shown in the top view of FIG. 1 is the IR filter incorporated into the image sensor 201.

Figure 3:
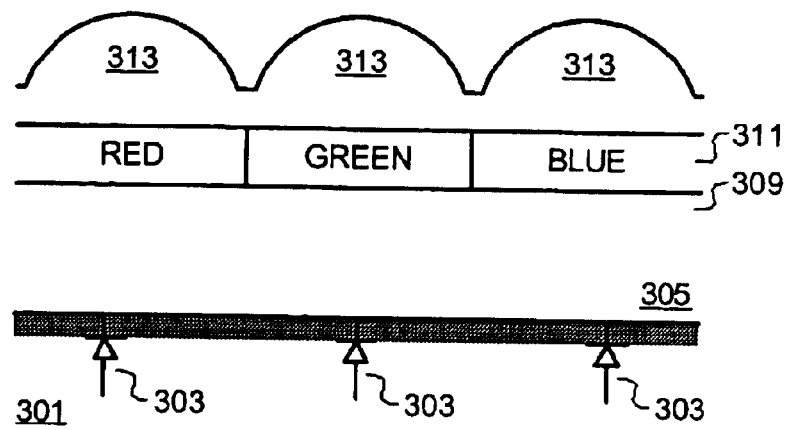
FIG. 3 is a prior art cross-sectional view of a semiconductor substrate illustrating an image sensor formed in a substrate.

FIG. 3 is a cross sectional view taken along line A—A of FIG. 2. As seen, a semiconductor substrate 301 has a plurality of light sensitive elements 303 (associated with the pixels 203 of FIG. 2) formed therein. FIG. 3 shows the light sensitive element 303 as a photodiode, though other substitutes and equivalents may be used. Details of forming the photodiode and other associated circuitry are known in the prior art and will not be repeated herein to avoid obscuring the present invention. However, examples of the prior art may be seen in U.S. Pat. Nos. 5,904,493 and 6,320,617.

According to one embodiment, after the pixels 203 are formed in the substrate, an optically transparent (in at least a portion of the visible spectrum) base material 305 is formed over the substrate 301. The base material 305 may be formed using a blanket deposition process and may be various forms of silicon dioxide, such as thermal oxide, chemical vapor deposition (CVD) oxide, or spin on glass. The base material 305 may also be thought of as an interlayer dielectric.

Next, color filters 311 are formed above the base material 305. The color filters 311 are formed using conventional processes. In the embodiment shown in FIG. 3, the color filters 311 are of the red, green, and blue coloration, but can be also cyan, yellow, and magenta. Finally, micro-lenses 313 are formed above the color filters 311. Similarly, the micro-lenses 313 can be formed using conventional processes, and may be convex as shown in FIG. 3 or other shape.

Figure 4:
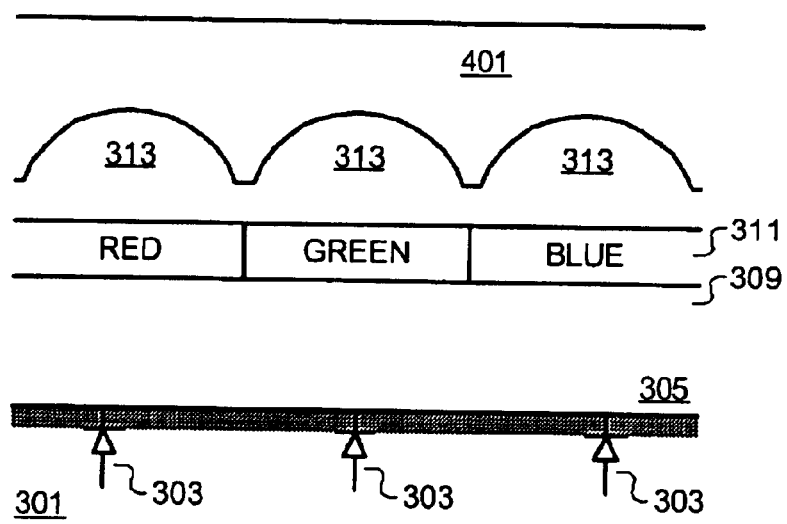
FIG. 4 is a cross-sectional view of a semiconductor substrate in accordance with one embodiment of the present invention.

Next, turning to FIG. 4, a sacrificial protective layer 401 is deposited over the micro-lenses 313. In one embodiment, the protective layer 401 is over the micro-lenses 313, but in other embodiments, the protective layer 401 should simply be the top most layer deposited just prior to dicing of the wafer. In some image sensors, the micro-lenses 313 are not the top most layer, but rather may include other layers, such as color filter layers or passivation layers.

In one embodiment, the protective layer 401 is a phenyl resin that is blanket deposited or otherwise formed over the entire wafer, spanning across multiple image sensor die. The thickness of the protective layer 401 is not crucial; however, the protective layer 401 should be thick enough to adequately protect the underlying micro-lenses 313 and withstand subsequent handling. In one embodiment, the protective layer 401 is between 1–3 microns thick.

According to one embodiment of the present invention, the protective layer 401 is spin coated over the top most layer. The protective layer 401 in one embodiment is polyglycidylmethylacrylate (PGMA) or polymethylmethylacrylate (PMMA). However, other types of materials may be substituted, but preferably materials that may be spun on and subsequently cured into a solid.

Figure 5:
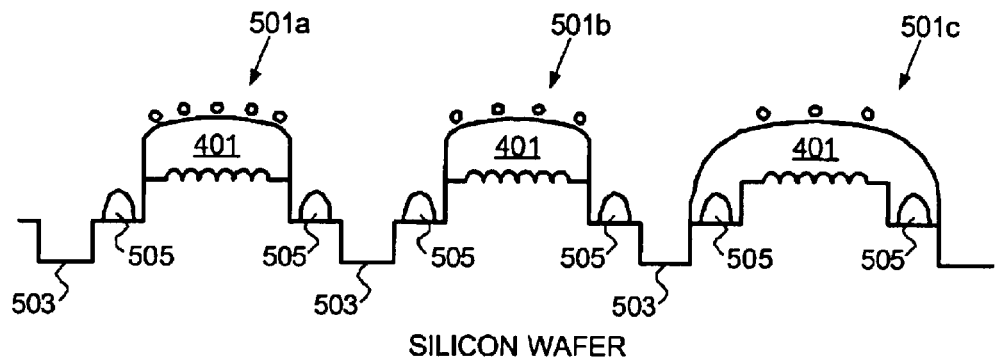
FIG. 5 is a cross sectional view of a semiconductor wafer showing multiple image sensor die formed on the wafer in accordance with one embodiment of the present invention.

Photoresist-type resin materials are advantageous in one embodiment since they can be directly patterned by exposure and development. Non-photoresist type materials, while still capable, would require a further etching step. Specifically, as seen in FIG. 5, the protective layer 401 is patterned such that the protective layer 401 is only over certain portions of the image sensor die 501. In the case of a photoresist-type material, the patterning of the protective layer 401 may be accomplished by exposing the protective layer 401 to an exposing radiation from, for example, a stepper machine. Then, the protective layer 401 can be developed to form the pattern shown in FIG. 5. In the case of a non-photoresist type material, the patterning of the protective layer 401 may require the use of various masking and etching techniques.

FIG. 5 is a cross section view of a portion of a silicon wafer having multiple image sensor die formed thereon. As seen, scribe lines 503 separate the individual image sensor die 501 from each other. Contact pads 505 (also referred to as contact bumps) are generally formed on the periphery of the image sensor die 501.

Note that in this embodiment the protective layer 501 generally only covers the pixel array area, though it may well cover other portions of the image sensor die 501 that require protection. In one embodiment, the protective layer 401 does not extend over the contact pads 505 in order to allow electrical connection to an IC package, such as through a bonding wire structure.

In other embodiments, the protective layer 401 extends completely over the contact pads 505. In such a situation, the protective layer 401 is removed prior to application of the bonding wires. This embodiment can be seen in FIG. 5 as image sensor die 501c.

Further as seen in FIG. 5, after the image sensor die 501 have been diced various particulates may deposit onto the protective layer 401. Because of the protective layer 401, the particulates do not fall onto the micro-lenses of the image sensor.

Figure 6:
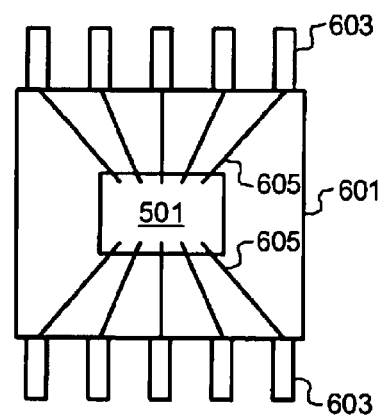
FIG. 6 is a schematic illustration of an image sensor die bonded to an IC package.

Turning to FIG. 6, after the image sensor die have been diced into individual die, the image sensor die 501 is then mounted onto an IC package 601. The IC package 601 may also be called a lead frame. The IC package 601 has a plurality of pins (in one typical embodiment 24, 28 or 48 pins). The pins 603 are electrically connected to the contact pads 505 of the image sensor die 501 by means of a bonding wires 605. There are various methods and techniques for packaging an image sensor die 501 to a package, and the present invention is applicable to any of them. In general, the process of mounting the die 501 to the package is a sensitive procedure that requires manipulation of the die 501 and other processes. This may further cause particulates to be generated. The protective film 401 further protects the micro-lenses from particulate damage and interference.

After the image sensor die 501 has been mounted onto the package, the protective layer 401 is removed by any number of means. For example, in the case of a phenyl resin, the protective layer 401 can be removed using a wet chemical process. Alternatively, various types of etching may be utilized. In one embodiment, the removal of the protective layer 401 should be tailored to the removal of the material constituting the protective layer 401, with little or no damage to the IC package 601, the bonding wires 605, and other components. Various techniques are known in the art for performing this removal, including but not limited to a wet chemical process.

Further, note that in the case where the protective layer 401 does not extend over the contact pads 505, the removal of the protective layer 401 is done after the bonding wires 605 have been attached. In the case where the protective layer 401 does extend over the contact pads 505, the removal of the protective layer 401 is done before the bonding wires 605 have been attached.

Figure 7:
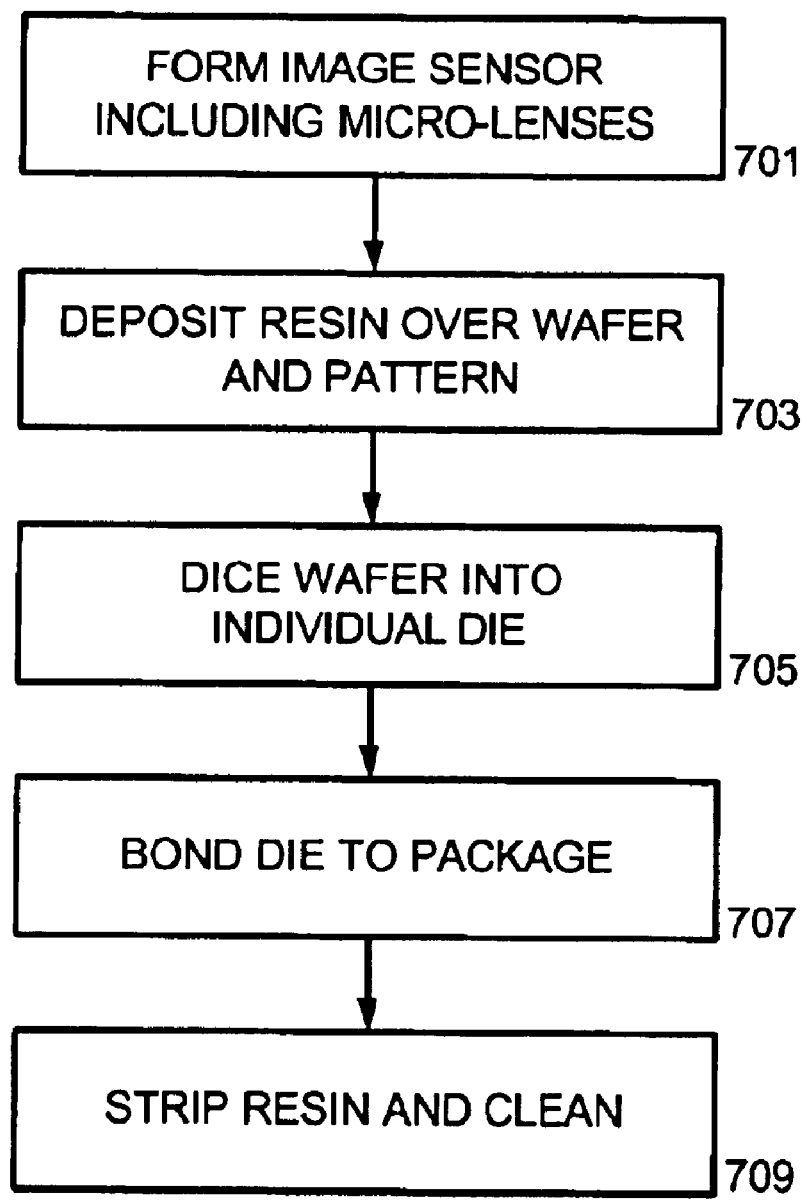
FIG. 7 is flow diagram illustrating the method of one embodiment of the present invention.

FIG. 7 illustrates a flow diagram showing the method of the present invention. First, at box 701, the image sensor die 501 are formed (including formation of the color filters and micro-lenses). Next, at box 703, the protective layer 401 (such as resin) is deposited over the wafer and patterned to cover the image sensor die 501. As noted above, the protective layer may or may not extend over the contact pads 505.

At box 705, the wafer is diced to separate the individual image sensor die 501 from each other. Once this has been done, the image sensor die 501 are then mounted onto an IC package 601 at box 707. If the protective layer 401 does not extend over the contact pads 505, at this point, the bonding wire structures are also attached between the contact pads 505 and the package pins.

At box 709, the protective layer 401 is removed, such as by wet stripping. The image sensor die 501 is also cleaned using conventional techniques. In the case of where the protective layer 401 does extend over the contact pads 505, at this point, the bonding wire structures are attached between the contact pads 505 and the package pins.

In this manner, it can be seen that the protective layer 401 is a temporary layer used to protect the image sensor die 501 from particulates and other damage during the dicing and mounting process. As a corollary, because of the use of the protective layer, the handling of the image sensor die 501 need not be as careful, making the packaging process more robust. There is a higher margin for error.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A method comprising:

forming a plurality of image sensor die having micro-lenses onto a semiconductor wafer;

forming a protective layer over said image sensor die;

dicing said wafer to separate said plurality of image sensor die;

mounting said image sensor die onto an integrated circuit package; and removing said protective layer from said image sensor die after said image sensor die is mounted on said integrated circuit package.

2. The method of claim 1 wherein said protective layer is a phenyl resin.

3. The method of claim 1 further including forming a color filter layer underneath said micro-lenses.

4. The method of claim 1 wherein said image sensor die have contact pads and said protective layer does not extend over said contact pads.

5. The method of claim 1 wherein said image sensor die have contact pads and said protective layer extends over said contact pads.

6. The method of claim 1 further including electrically connecting said image sensor die to said integrated circuit package after said protective layer is removed.

7. The method of claim 1 further including electrically connecting said image sensor die to said integrated circuit package before said protective layer is removed.

8. A method comprising:

forming a plurality of image sensor die having micro-lenses onto a semiconductor wafer;

forming a protective layer over said image sensor die;

removing portions of said protective layer;

dicing said wafer to separate said plurality of image sensor die;

mounting said image sensor die onto an integrated circuit package; and removing said protective layer from said image sensor die after said image sensor die is mounted onto said integrated circuit package.

9. The method of claim 8 wherein said protective layer is a phenyl resin.

10. The method of claim 8 further including forming a color filter layer underneath said micro-lenses.

11. The method of claim 8 wherein said image sensor die have contact pads and said protective layer does not extend over said contact pads.

12. The method of claim 8 wherein said image sensor die have contact pads and said protective layer extends over said contact pads.

13. The method of claim 8 further including electrically connecting said image sensor die to said integrated circuit package after said protective layer is removed.

14. The method of claim 8 further including electrically connecting said image sensor die to said integrated circuit package before said protective layer is removed.

* * * * *